United States Patent [19]

Ackerman et al.

[11] Patent Number: 5,022,930
[45] Date of Patent: Jun. 11, 1991

[54] THIN FILM PHOTOVOLTAIC PANEL AND METHOD

[75] Inventors: Bruce Ackerman; Scot P. Albright; John F. Jordan, all of El Paso, Tex.

[73] Assignee: Photon Energy, Inc., El Paso, Tex.

[21] Appl. No.: 369,181

[22] Filed: Jun. 20, 1989

[51] Int. Cl.$^5$ ............... H01L 31/048; H01L 31/18
[52] U.S. Cl. .................................. 136/251; 437/2; 437/5; 437/210; 437/223; 437/224
[58] Field of Search ............... 136/251; 437/2–5, 437/207, 210, 221–224

[56] References Cited

U.S. PATENT DOCUMENTS

| | | | |
|---|---|---|---|
| 3,778,684 | 12/1973 | Fischer et al. | 136/256 |
| 4,078,944 | 3/1978 | Mlavsky | 136/246 |
| 4,239,555 | 12/1980 | Scharlack et al. | 136/251 |
| 4,578,526 | 3/1986 | Nakano et al. | 136/251 |
| 4,633,032 | 12/1986 | Oido et al. | 136/251 |
| 4,705,911 | 11/1987 | Nakano et al. | 136/251 |
| 4,735,909 | 4/1988 | Albright et al. | 437/4 |

Primary Examiner—Aaron Weisstuch

[57] ABSTRACT

A thin film photovoltaic panel includes a backcap for protecting the active components of the photovoltaic cells from adverse environmental elements. A spacing between the backcap and a top electrode layer is preferably filled with a desiccant to further reduce water vapor contamination of the environment surrounding the photovoltaic cells. The contamination of the spacing between the backcap and the cells may be further reduced by passing a selected gas through the spacing subsequent to sealing the backcap to the base of the photovoltaic panels, and once purged this spacing may be filled with an inert gas. The techniques of the present invention are preferably applied to thin film photovoltaic panels each formed from a plurality of photovoltaic cells arranged on a vitreous substrate. The stability of photovoltaic conversion efficiency remains relatively high during the life of the photovoltaic panel, and the cost of manufacturing highly efficient panels with such improved stability is significantly reduced.

42 Claims, 1 Drawing Sheet

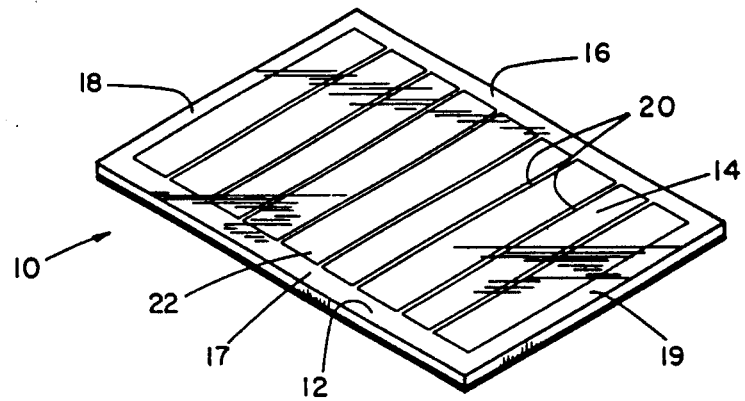
FIG. 1
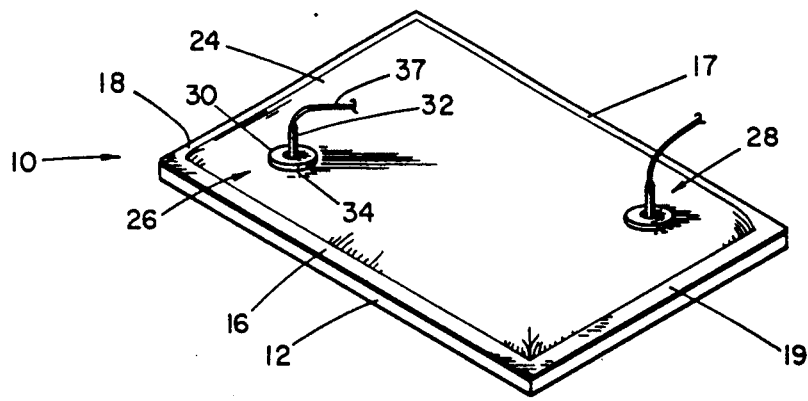
FIG. 2
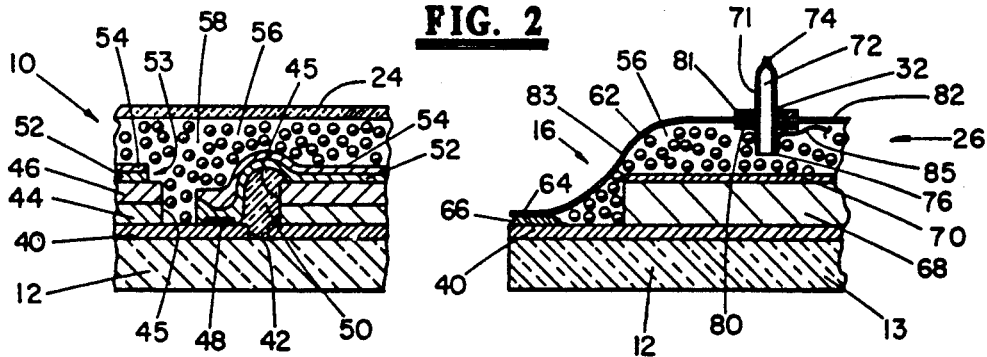
FIG. 3   FIG. 4

THIN FILM PHOTOVOLTAIC PANEL AND METHOD

This invention was made with Government support under subcontract ZL-7-06031-3 awarded by Midwest Research Institute under contract DE-AC02-83CH10093 awarded by the Department of Energy. The Government has certain rights in this invention.

BACKGROUND OF THE INVENTION

1. Field of the Invention

The present invention relates to the design and manufacture of thin film photovoltaic cells and, more particularly, to commercially practical techniques for forming a protective backcap on a photovoltaic panel such that high panel efficiency stability is maintained during the life of a photovoltaic panel.

2. Description of the Background

Photovoltaic technology has been widely used for years in every industrialized nation. Common devices, such as watches worn by thousands of people, are powered by sunlight, and buoys in numerous shipping channels throughout the world are lighted by an array of photovoltaic crystal slices electrically connected in series. Within the past decade, photovoltaic technology has slowly been applied to the manufacture of photovoltaic panels to drive increasing numbers of remotely located electrically powered devices, such as refrigerators for the storage of medicine, pumps for irrigation, and telecommunication stations. Visionaries, however, plan for the large scale manufacture of photovoltaic panels in sufficient quantities to power entire villages worldwide. If such an objective is to be achieved, the manufacturing cost for photovoltaic panels should be low, the panel conversion efficiency should be relatively high, and the photovoltaic panels should exhibit high conversion efficiency stability during the life of the panels.

Those skilled in the art have long recognized that low manufacturing cost for photovoltaic panels can be achieved through the use of thin film photovoltaic technology, especially when that technology is applied to large scale manufacturing operations. Relatively high photovoltaic conversion efficiencies beyond the order of 7% and 8% can now be obtained in commercial production operations. While others have addressed the problem of protecting thin film photovoltaic cells from adverse exterior environmental elements, such as water or reactive gases, the present invention is uniquely able to tie these prior achievements together by providing a low cost, commercially practical technique for protecting the photovoltaic cells from both interior and exterior elements. The invention also enables the manufacturer to subject the cells to a selected gas during processing and during the life of the panels, thereby achieving the desired high conversion efficiency and long panel life.

Techniques relating to the manufacture of photovoltaic cells have been devised for decades. Concepts developed in the 1960's are disclosed, for example, in U.S. Pat. Nos. 3,520,732 and 3,568,306. Thin film photovoltaic cells may be easily formed on a vitreous substrate, such as glass, as taught by U.S. Pat. Nos. 4,086,101, 4,362,896, 4,412,091, 4,265,933. Photovoltaic cells formed on a glass substrate may be connected electrically in series, as taught by U.S. Pat. No. 4,243,432. A plurality of electrically connected cells thus form a solar panel, and a number of solar panels may be mounted in a module as taught by U.S. Pat. No. 4,233,085. Large scale manufacturing techniques for forming such panels are disclosed in U.S. Pat. No. 3,880,633, 4,228,570, 4,307,681, 4,239,809, 4,492,605. The bottom electrode layer for each of the plurality of thin film photovoltaic cells may be formed from various materials and by various techniques, such as those disclosed in U.S. Pat. No. 4,401,291, 4,178,395, 4,256,513, 4,362,896.

A photovoltaic cell having a cadmium telluride layer is disclosed in U.S. Pat. No. 4,568,792. Techniques for reducing manufacturing costs for forming such a cell, which includes a polycrystalline monolayer, are disclosed in U.S. Pat. No. 4,735,909. U.S. Pat. No. 4,578,526 discloses a thin film photovoltaic cell on a glass substrate, with the photovoltaic unit including a back plate which is adhered with a resin layer to protect the photovoltaic cell.

U.S. Pat. No. 4,633,032 discloses another type of solar cell on a glass substrate. The solar cells are arranged in a rather complex "package configuration", and the frame of the package houses a desiccant. This "package configuration", which significantly increases the material costs and manufacturing costs for the solar panels, also includes a synthetic encapsulating resin which adheres to the back plate as well as the glass substrate, and provides the desired stress relief between components of the complex frame. U.S. Pat. No. 4,705,911 discloses a solar cell module which includes a CdS/CdTe heterojunction, with the photovoltaic cell also being formed on a vitreous substrate. This patent discloses an oxygen releasing agent spaced adjacent the vitreous substrate for minimizing the reduction and its associated decrease in conversion efficiency, thereby increasing the useful life of the photovoltaic cell.

Prior art techniques for forming a protective back plate or backcap on a photovoltaic cell are expensive to manufacture and/or do not adequately protect the photovoltaic cell from exterior environmental elements or exhibit incompatabilities with the chemically sensitive film layers. The present invention overcomes the problems and disadvantages of the prior art, and enables the manufacture of photovoltaic cells having a relatively high conversion efficiency and a low cost. Thin film photovoltaic technology may thus be applied in commercial applications to achieve the necessary high cell conversion efficiency stability required by purchasers of such photovoltaic panels.

SUMMARY OF INVENTION

In a suitable embodiment of the present invention, thin film photovolatic cells are formed on a glass substrate. Light passes through the glass substrate, through a thin conductive tin oxide layer, and is absorbed near the heterojunction formed by the cadmium sulfide and cadmium telluride layers. A "top" electrode layer (although presumably light passes down to the cells, the cell is conventionally inverted as manufactured for use) provides a junction for interconnecting elongate strips of photovoltaic cells in electrical series. This series connection can be formed by a process which results in the electrode layer lying in an uneven plane, which is not deleterious to the formation of the backcap according to the present invention. The backcap, in conjunction with the glass substrate, protects the film layers which form the photovoltaic cells and thus increases the useful life of the photovoltaic device.

The backcap may be formed from a pliable thin metal sheet or foil, or a formed glass plate, which is sealed about its periphery to the glass substrate base. The backcap need not contact the top electrode, but rather a spacing is intentionally formed between the backcap and the top electrode layer. This spacing is preferably filled with a desiccant, and gas in this spacing is purged subsequent to the backcap being sealed to the base. Purging of this spacing is accomplished by placing a pair of flow passageways through the backcap, which are sealed after the desired purging to retain a selected gas in the spacing and in contact with the photovoltaic cells as well as to provide an insulated electrical feed-though.

It is an object of the present invention to provide an improved photovoltaic device consisting of a plurality of photovoltaic cells and having a relatively low material cost. It is a further object of the invention to provide such a cell which is designed and constructed so that it also has a relatively low manufacturing cost, since expensive equipment is not required to form or apply the protective backcap over the cells.

It is a further objective of the present invention to provide a photovoltaic cell with a unique backcap which provides a substantially planar spacing between the backcap and the active layers of the photovoltaic cell. This spacing may be filled with a selective gas subsequent to sealing the backcap to the base of the photovoltaic cells, and achieves high photovoltaic conversion efficiency and stability for the photovoltaic product, such that the useful life of the product is substantially enhanced.

Still another object of the present invention is to provide a relatively low cost encapsulation systems for protecting photovoltaic cells which will substantially reduce the concentration of chemicals, such as water, which will come in contact with the thin film layers of the photovoltaic cell and thereby adversely effect conversion efficiency and the life of the photovoltaic cell.

It is a feature of the present invention to provide a photovoltaic cell with a backcap which may be easily sealed to the panel substrate. Noxious gases and elements produced as a result of that bonding or sealing process between the backcap and the substrate which are trapped in the spacing between the photovoltaic cells and the backcap may be removed, thereby purging the environment surrounding the photovoltaic cells. Moreover, a desiccant may be provided in this spacing, and a selected gas may be input into the spacing at the conclusion of the purging process to further reduce the efficiency decline of the cell during the life of the device.

It is a further feature of the present invention to provide a readily sealable input port and a readily sealable output port through the backcap, such that purging can be easily accomplished and the selected gas sealed in this spacing between the backcap and the cell.

It is yet another feature of the present invention to substantially minimize the presence of water vapor in contact with the cells. A desiccant may be provided in the spacing between the backcap and the cells, so that any slow passage of water vapor through the adhesive bond during the life of the product will not significantly damage the thin film layers.

An advantage of the present invention that the photovoltaic cells including a backcap can be easily formed on a vitreous substrate. It is a further advantage that the concepts of the present invention are applicable to either front wall photovoltaic cells or backwall photovoltaic cells. Still another advantage of the present invention is that the products and techniques used to protect the photovoltaic cells from adverse environmental elements are themselves environmentally safe.

These and further objects, features, and advantages of the present invention will become apparent from the following detailed description, wherein reference is made to the figures in the accompanying drawings.

BRIEF DESCRIPTION OF THE DRAWINGS

FIG. 1 is a pictorial view illustrating the top of a photovoltaic panel according to the present invention, the assumption being that sunlight shines down onto the panel.

FIG. 2 is a pictorial view illustrating the backcap for the photovoltaic panel shown on FIG. 1.

FIG. 3 is a simplied cross-sectional view illustrating a series interconnection of photovoltaic cells forming a panel according to the present invention, and illustrating the relationship between that series interconnection and the backcap.

FIG. 4 is a simplified cross-sectional view of another embodiment of a photovoltaic cell, and illustrating the fluid-tight connection between the backcap and the base of the panel, as well as one of the combination vent ports and electrical conductors passing through the backcap.

DETAILED DESCRIPTION OF PREFERRED EMBODIMENTS

The photovoltaic cells which form a photovoltaic panel according the present invention are preferably manufactured according to photovoltaic thin film photovoltaic processes well known to those skilled in the art. Such cells may be fabricated, for example, from various processes conventionally used to form photovoltaic thin film layers of a photovoltaic cell, including vacuum deposition, pyrolytic spray techniques, close-spaced sublimation, hot wall evaporation, electroplating, and screen printing. For purposes of the following discussion, the particular processes involved are a chemical spray and vacuum deposition, although any of the conventional processes may be used. Also, the particular photovoltaic panel disclosed herein is a relatively large area photovoltaic panel having exemplary dimensions of 30 centimeters by 30 centimeters. The photovoltaic cell includes a CdS layer and a CdTe layer, which together form the photovoltaic heterojunction which generates electrical current directly from sunlight, according to well known techniques.

Referring now to FIGS. 1 and 2, a photovoltaic panel 10 is shown, including an active photovoltaic area 14 which may have the exemplary 25 centimeter by 25 centimeter area discussed above, such that the area of the glass substrate 12 may be 27 centimeters by 27 centimeters. The thin side edges 16 and 17, as well as the end edges 18 and 19 of the photovoltaic panel are inactive, and thus do not contribute to the electrical output of the photovoltaic panel 10.

The active area 14 of the photovoltaic panel is formed by a plurality of relatively narrow and elongate photovoltaic cells 22, each of which appears in FIG. 1 as a single strip. Adjacent edges of the individual cells 22 are separated by the series interconnection between the photovoltaic cells, which is discussed in detail below, and which appear in FIG. 1 as wide "lines" 20 between the photovoltaic cells. Further details with respect to photovoltaic cells which are visually similar to these shown in FIG. 1 may be obtained from a review of the prior art patents previously cited, including particularly U.S. Pat. No. 4,262,411.

Although sunlight is directed downwardly through the vitreous substrate 12 and then to the thin film layers below the substrate which form the photovoltaic cell, the "backside" or lower side of the photovoltaic panel 10 is shown uppermost in FIG. 1, since the term "top" and "bottom" for such cells generally refers to its relative position when manufactured, and during manufacture the substrate 12 is typically the base for the thin film layers above the substrate.

Since the substrate 12 is glass, the same edge strips 16, 17, 18 and 19 shown in FIG. 1 are also apparent in FIG. 2 and form the periphery seal with the backcap. Also, it should be understood at this stage that the glass substrate 12, as well as the backcap 24 discussed subsequently, form the bulk of the photovoltaic panel 10, since the individual thin film layers which form the photovoltaic cells as well as the materials which form the series interconnection between the photovoltaic cells occupy little volume and contribute only slightly to the weight of the photovoltaic panel. Although further details will be discussed subsequently, it should be understood from FIG. 2 that a suitable backcap 24 according to the present invention may be fabricated from a pliable sheet of metal which is bent along its perimeter to form a fluid-tight seal with the base of the photovoltaic panel. A suitable backcap may be fabricated from tin or zinc plated steel having a thickness in the range of from 2 to 8 mils.

In addition to the backcap 24 and the substrate 12 discussed above, the photovoltaic panel as shown in FIG. 2 includes a gas entry mechanism 26 and a gas exit mechanism 28, each of which may be structurally identical. Mechanism 26 includes an electrically conductive small diameter flow conduit 32, which passes through the sheet metal backcap, and is sealed therewith by a washer like plate 34. Plate 34 is thus sealed to the conduit 32, and is bonded to the backcap 24 by any suitable means, such as by soldering 35. The small diameter flow conduits 32 for each of the input and output ports also serve as electrical conductors, such that lead lines 36 and 37 transmit direct current to a suitable device, such as a storage battery. Accordingly, one of the ports 26, 28 may be considered the positive output terminal of the photovoltaic device, while the other port is considered the negative terminal.

FIG. 3 depicts in cross-section the photovoltaic panel 10 generally discussed above. In particular, the thin film photovoltaic cell shown in FIG. 3 includes a CdS/CdTe heterojunction, although again the concepts of the present invention are applicable to other types of thin film photovoltaic cells. The type of cell shown in FIG. 3 has been selected for an exemplary discussion, since it has shown good potential for achieving the low cost manufacturing and relatively high efficiency desired for such devices. Also, the CdTe layer is considered particularly sensitive to degradation, and accordingly the environmentally protective backcap is well suited to protect this layer. Small CdS/CdTe photovoltaic cells manufactured using commercially viable techniques have a photovoltaic conversion efficiency of over 10%. A one foot square panel manufactured by production techniques generates an output of over 6.1 Watts, and has an active area conversion efficiency for that panel of more than 8%.

Degradation of the series resistance for unencapsulated photovoltaic devices having a CdS/CdTe heterojunction has been observed at elevated temperatures in humid surroundings. The sensitivity of such a device to humidity has been shown to be primarily a matter of a degradation of the electrical contact to the CdTe layer. The increase in series resistance can be significant above 50° C. with as little as a 20% relative humidity environment. It has been noted that a marked improvement in photovoltaic conversion efficiency is observed when the vapor pressure of water present is reduced to a minimum. The sensitivity of the stability of the electrical contact has also been observed in the presence of acids, solvents, and general oxidizing agents. These sensitivies preclude the use of many otherwise viable encapsulation methodologies due to chemical incompatibilities. For example, while a silicon based gel might serve as a suitable encapsulant to protect environmental elements from contacting the photovoltaic cell, the silicon gel itself may release water at high temperatures, and thereby adversely effect the photovoltaic coversion efficiency stability. A secondary sensitivity to air (having 20% oxygen) has also been observed. In dry air at temperatures exceeding 90° C., a slow degradation of the ohmic contact has been observed as an in series resistance. Reducing the oxygen concentration in the atmosphere surrounding the device utilizing an inert gas has thus been devised as an appropriate method of improving stability.

Earlier attempts to achieve the desired goals for an encapsulation system have not been fully satisfactory due to the sensitivities noted above. Backcaps formed from a laminated aluminum foil have been suggested which may be adhered directly to the active cell material on the substrate using thermoplastics, epoxies, or various other thermosets. The choice of adhesive suggested during those earlier studies was severely limited since evolution during the bonding process produced contaminants, such as water, alcohols, aldehydes, ketones, acids, and/or oxidizers (such as peroxides and acrylic acids), which necessarily must be kept to a minimal concentration to prevent chemical reaction with the photovoltaic cells and thereby adversely effect stability. Since it has been observed that the CdS/CdTe electrical contact exhibited some sensitivity to most of these by-products, the goal according to the present invention is to not allow the evolved by-products of sealing the backcap to the photovoltaic panel base to cause significant degradation of the photovoltaic conversion efficiency over time.

One other attempt for devising a suitable encapsulation system involved the use of ethylene vinyl acetate (EVA) based polymers to adhere a foil or metal sheet to the substrate. EVA is a thermosetting thermoplastic that is generally formulated. By utilizing less severe peroxide and by minimizing the laminating time temperature cycle, only a small less than about 5%) degradation of the panel output has been maintained during the process of sealing the back plate to the substrate. Since the long term stability of the photovoltaic cell remained a problem, however, significant degradation over time was observed during the life tests of the photovoltaic cell, and it is believed that such long term degradation is primarily due to the chemical reaction between the encapsulation materials and the active layers of the photovoltaic cell. Accordingly, it was deduced that a viable encapsulation system, particularly for a photovoltaic cell having a cadmium telluride layer, satisfied several requirements (1) the sensitivity of the photovoltaic cell to many chemicals, including water, necessitates that only innocuous materials are in contact with the thin film layers of the photovoltaic cell; (2) innocuous gases and materials evolved from the process of sealing the backcap to the panel substrate, and/or residuals from the panel producing process itself, should be removed during encapsulation rather than being sealed within the photovoltaic panel; (3) the preferred encapsulation technique should evidence an ability to adjust the gaseous environment surrounding the photovoltaic cells, such that this gas may be purged from the panel and a selected gas finally sealed between the backcap and the substrate so that the selected gas surrounds the photovoltaic cells during their useful life; (4) techniques should be used to significantly control the concentration of water vapor which is allowed to contact the thin film photovoltaic cells, both during and after the encapsulation process.

Referring now to FIG. 3, the photovoltaic cell depicted includes a glass substrate 12 which, in conjunction with the conductive tin oxide layer, serves as a base for a plurality of photovoltaic cells. Light is thus transmitted through the base 12 and the tin oxide layer 40, and thereby reaches the heterojunction of the photovoltaic cell. Those skilled in the art appreciate that the photovoltaic cells shown in FIGS. 3 and 4 are clearly not to scale, since the relative thicknesses of the thin film layers is nominal compared to the thickness of the gas substrate. Thus FIGS. 3 and 4 illustrate the concepts of thin film layers on glass, although the actual thicknesses of the thin film layers should be understood as being in the range discussed in the prior art patents cited earlier.

As shown in FIG. 3, the tin oxide layer 40 includes a series of cuts through the tin oxide layer and down to the glass 12. Each of the cuts 42 is provided in the vicinity of an elongate series electrical connection discussed subsequently, such that one cut 42 would be provided along each of the strips 20 shown in FIG. 1. Although various techniques may be used to formulate the thin elongate cut through the tin oxide layer 40, lasers are particularly well suited for achieving this function.

Directly above the tin oxide layer 40 is the CdS layer 44. (Again, it should be understood that it is conventional to show the photovoltaic devices in cross-section in accordance with FIGS. 3 and 4 since the glass substrate 12 serves as the base for the photovoltaic cells during the manufacturing process, although in use the light travels down through the substrate 12 and to the thin film layers which form the photovoltaic heterojunction, so that the backcap 24 is typically beneath the photovoltaic panel when in use.) Directly above the CdS layer 44 is the CdTe layer 46. Both layers 44 and 46 are divided by another elongate cut 45, which is substantially wider than the cut 42 through the tin oxide layer. The cut 45 may be formed by various techniques, such as sandblasting. Above the CdTe layer is a thin film electrode layer 53, which may be formed from the first graphite-based electrode layer 52 for forming the desired electrical connection with the CdTe layer, and a second highly conductive electrode layer 54 directly above layer 52. A substantially planar spacing 56 is provided between the electrode layer 53 of each of the photovoltaic cells 22 and the backcap 24, and may be in the order of from 0.2 to 1.0 centimeters thick. Substantially planar spacing 56 preferably is filled with a desiccant 58, as explained further below. Accordingly, it may be seen in FIG. 3 that the backcap 54 is prevented from physically contacting the electrode layer 53.

In order to perform the series interconnection, it should be understood that the tin oxide layer 40 may be "cut" to achieve slot 42, and subsequently the CdS and the CdTe layers cut to achieve the slots 45. A selected electrode strip may, if desired, be placed on top of the tin oxide layer 40 as shown in FIG. 3, and a permanent resist material 50 used to "fill" the slot 42 and cover one edge of each of the layers 44 and 46. Thereafter, a removeable resist may be applied to a remaining portion of the volume formed by slot 45, and the electrode layer 53 thereafter evaporated onto the prior layers and over above the removeable resist strip (not shown) and the permanent resist strip 50. Thereafter, the removeable resist strip is removed, which then "breaks" the path of the electrode layer and thereby forms the desired series interconnection of the photovoltaic cell. Further particulars with respect to the formation of such a series interconnection between photovoltaic cells is disclosed in U.S. Pat. No. 4,262,411, hereby incorporated by reference.

It should be understood that each of the thin film layers which form the photovoltaic cells for the panel according to the present invention preferably lie within a single plane, with the possible exception of the electrode layer 53 (individual layers 52 and 54 forming layer 53). Accordingly, it should be noted that while the majority of the electrode layer 53 in each of the cells does lie substantially within a single plane, a portion of that layer for each of the photovoltaic cells lies just slightly above and drops slightly below that plane, as shown in FIG. 3. This feature does not, however, adversely effect the encapsulation technique for protecting the photovoltaic cells as disclosed herein.

FIG. 4 depicts another embodiment of a photovoltaic cell according to the present invention, and further illustrates the fluid-tight seal formed between the backcap 82 and the base 13 of the photovoltaic panel, the latter component including both the glass substrate 12 and the tin oxide layer 40. Accordingly, it should be understood that the entire area extent of the active area 68 of the photovoltaic panel, which includes the electrode layer 70 for each of the plurality of photovoltaic cells, may be "covered" by a unitary substantially planar metal foil backcap 82. Backcap 82 is preferably pliable, and can be easily bent at 62 to form the contoured edge configuration shown in FIG. 4 along its entire perimeter. Bend 62 includes a substantially planar edge strip 64 which preferably is substantially parallel to the surface of the tin oxide layer 40 opposite the glass 12. To seal the backcap 82 to the base 13 of the photovoltaic panel, a desired adhesive 66 may be applied to the perimeter of the base, and the combination of pressure and heat used to "cure" this seal. Once cured, the seal prevents substantial quantities of either gas or moisture from entering the spacing 56 between the backcap 82 and the base 13, and thus prevent exterior elements from acting on the thin films which form the active area of the photovoltaic panel. Again, it can be seen in FIG. 4 that the sheet metal plate 82 does not contact any of the thin film layers which form the photovoltaic cells, but rather is preferentially spaced from such layers as disclosed herein. Also, it should be understood that the adhesive layer 66 is shown conceptually in FIG. 4, since the layers 66 normally would not have a thickness as great as the thickness of the backcap 82.

Since the edge of the backcap around its entire periphery is sealed to the base 13 of the photovoltaic panel as explained herein, the annular spacing 56 is essentially sealed from the exterior enviroment. It should be understood, however, that this seal may be either a hermetic seal or a "semi-hermetic" seal. More specifically, a true hermetic seal does not allow the transfer of fluids past the seal over an extended period of time, such that hermeticity level approaches $10^{-11}$ units. Such a seal, which may be formed by a solid glass or a steel barrier, is considered a true hermetic seal, as would be any satisfying hermeticity units in excess of about $10^{-11}$ units. The sealed formed by the present invention may be thought of as "semihermetic" seal, meaning that it is able to exhibit hermeticity levels which result in units of at least $10^{-3}$, and preferably at least $10^{-4}$ units. Accordingly, it should be understood that the term "semi-hermetic" used herein means a seal having a hermeticity level of at least $10^{-3}$ units. In the short term, of course, the seal formed by the backcap 62, the adhesive 56, and the base 13 is a fluid-tight seal, meaning that neither liquid nor gases can be considered as passing through the seal over a relatively short period of time.

Prior to the adhering the backcap to the base of the photovoltaic panel, the input and output port mechanism 36 and 37 are secured to the backcap in a manner as shown in FIGS. 2 and 4. Also, the spacing 56 between the backcap and the base 13 which is not occupied by the thin film layers may be filled with a selected desiccant to maintain a very low water vapor content in the environment surrounding the cells. Zeolite is a perferrential desiccant according to the present invention, since it is also thermally conductive and accordingly assists in transferring undesirable heat generated in the thin film layers as result of the photovoltaic process to the metal backcap, thereby assisting in the dissipation of heat from the photovoltaic device and thus further reducing degradation. The desiccant 58 may "loosely" fill the spacing between the backcap and the base. Alternatively, relative movement between one desiccant particle and another desiccant particle within the spacing 56 may be substantially fixed by using a small amount of adhesive, which bonds the desiccant particles together and to the inside surface 83 of the backcap 82. In this latter case, the desiccant material is bonded to the backcap 82, and then the backcap and desiccant material may be placed in position as shown in FIG. 4 for bonding the backcap to the base 13.

As previously noted, the input port mechanisms 28 and 30 are preferably fixed to the metal backcap prior to placing the backcap in position over the base 13. Since each of the ports may be substantially identical, only one port 32 is discussed herein. Input port 32 consists of a small diameter tube 71 having a axially centered flow passage 72 therethrough. At the conclusion of the operation discussed subsequently, one end of the flow passageway may be sealed off by any suitable means, such as by a crimping and soldering operation which results in 74. The opposite end 76 of the tube 71 remains open, so that the interior 72 of the sealed off tube 71 and the spacing 56 between the backcap and the base 13 are in fluid communication. The fluid-tight seal between the tube 71 and the backcap 82 may be formed by various techniques, which may include the utilization of washer-like plates 80 and 81 each sealed to the outer diameter surface of the conduit 71, and also sealed to a respective interior or exterior surface of the plate 82 by soldering, glass frit, or by any other suitable technique.

The conduit 71 preferably serves three functions: it allows for the entry or egress of a gas which purges the spacing 56, it allows for easy sealing of the spacing 56 from the exterior environment surrounding the photovoltaic panel, and it serves as an electrical conductor for transmitting electrical energy past the backcap 82 and hence to its desired source, such as a battery or an electrical motor. Accordingly, it should be understood that a thin wire 85 electrically connected at one end to a selected photovoltaic cell may be electrically connected at its opposite end to tube 72, such that the sidewalls of the tube 72 serve as an electrical conductor for transmitting current past the plate 82. The washer-like members 80 and 81 electrically isolate the tube 71 from the backcap 82, such that power generated by the photovoltaic process is not "lost" to the backcap 82. Accordingly, slightly larger diameter electrical wires 36 and 37 are each connected to a respective pin member or conduit 32, as shown in FIG. 2, so that these wires allow for the transmission of direct current to a battery.

More particularly, it should be understood that the formation of the photovoltaic panel according to the present invention may include the formation of thin film photovoltaic cells and the series interconnection of those cells in a manner similar to that disclosed in U.S. Pat. No. 4,262,411. Once these cells have been formed and connected electrically in series, a backcap of a selected material may be punched so that a rectangular-shaped sheet is formed for sealing against the base 13, as explained above. Simultaneously or separately, passageways may be stamped through the backcap with each passageway to receive one of the flow port mechanisms discussed above. Each of these mechanisms 28 and 30 provide a hermetic seal between their respective conduit 71 and the backcap, allow for the passage of gas past the backcap, and avoid transmission of electrical energy passing through the conduit walls to be lost to either the backcap 82 or the electrode layer 70. This hermetic seal can be obtained by soldering or welding the members 80 and 81 to the interior and exterior surfaces of the backcap, as shown in FIG. 4.

As previously noted, desiccant may be held in place against the backcap 82, and the backcap then placed over the photovoltaic cells. Prior thereto, however, the tin oxide layer 40 in the vicinity of the perimeter strips 16, 17, 18 and 19 preferably is cleaned, and the interior surface of the backcap is similary prepared for proper adhesion to the tin oxide layer. If the backcap 82 is formed from the material previously disclosed, the tin plating on the steel may be removed along its peripheral edge by sandblasting or wire brushing, and films on the tin oxide layer similarly removed by an abrasive brush or sandblasting. Once these surfaces are prepared, and an adhesive, such as an epoxy, is applied to the peripheral edging of the backcap 82, and the wires 85 are respectively connected electrically to the conduit tubes 71 as explained above. (Alternatively, if desiccant has not been secured to the backcap 82, it may be positioned on top of the cells for at least partially if not fully filling the space between the backcap and the base, and the backcap then placed over the cells and desiccant then into engagement with the base 13.) The backcap is then glued to the base 13, and pressure is applied, e.g. by clamping, in a conventional fashion.

The bond between the backcap and the base is preferably cured at a temperature of about 80° C. for about five hours, during which time a selected gas is passed through the input port mechanism and out through the output port mechanism to purge the spacing 56, thereby removing any noxious by-products of the curing process from the interior of the fluid-tight assembly. Toward the conclusion of this purging process, another or the same gas, such as argon, helium, nitrogen or another inert gas, may be input to spacing 56 to fill the spacing 56 not occupied by the desiccant, and both tubes 71 may then be hermetically closed off by a crimping and soldering operation so that selected gas is sealed within the spacing 56 and surrounding the cells. If desired, a partial vacuum or a pressure slightly greater than ambient may be left with the spacing 56 between the backcap and the base.

From the foregoing, it should be apparent to those skilled in the art that the problem with incompatibility of materials in contact with the CdS/CdTe layers is obviated by the present invention, since no direct contact with any adhesive need be made according to the process of the present invention. Also, the approach of the present invention obviates the problems observed with a great number of adhesives, since the by-products evolved during the bonding steps, which previously adversely affected the electrical output of the panel, can be swept away in the gas purging step. Moreover, the ability to adjust the oxygen concentration inside the spacing 56 and surrounding the photovoltaic cells to an optimum level is quite practical with the techniques of the present invention. After noxious chemicals have been swept out of the spacing 56 during the bonding and curing steps for sealing the backcap to the base of the cells, a selected inert gas can be utilized to reduce even further the slow degradation that occurs in a 20% oxygen environment having little or no moisture.

The seal for maintaining a low vapor pressure of water for an extended time period between the backcap and the base may be accomplished by either or both of two techniques. First, the reduction of the sealed bond area according to the concepts of the present invention compared to most prior art encapsulation techniques significantly reduces the water vapor generation. For example, the bond line of from 1 to 5 mils thick and ¼" wide on a 4" by 6" base (having a perimeter of 20") passed less than 10 mg of water vapor after more than three months of exposure at 80% RH, in 80° C. Second, the small amounts of water vapor reaching the spacing 56 are quickly absorbed by the desiccant. The desiccant of choice should have a large capacity to absorb water, and the ability to retain the water at elevated temperatures. Maintaining a low partial pressure of water at temperatures expected for the exterior environment about the panel is thus highly desirable for the selected desiccant.

The techniques described above incorporate the use of a relatively soft adhesive to bond the backcap 82 to the base 13, with the adhesive acting as a damper to reduce stresses between the backcap and the base. The stresses which would generally develop between these components are primarily due to stresses caused by the difference in the coefficients of expansion between the bonded surface, and it should be understood that the device 10 as shown in FIG. 1 may become heated over ambient temperature due to the photovoltaic operation. As an alternative to dampening or reducing those stresses, the stresses can be minimized or eliminated by utilizing components which have a nominal difference in expansion coefficients. Since the exposed surface of the base 13 is the tin oxide layer 40, it is believed that stresses can be substantially reduced by using a backcap 82 formed from a titanium or nickel based alloy. According to one embodiment, the entire sheet-like backcap may be formed from such an alloy. Alternatively, only the edge portion of the backcap need be formed from such an alloy, and the remainder of the backcap could be formed from a different material.

One advantage of the stress reduction embodiment compared to the embodiment shown in FIG. 4 is that the latter embodiment facilitates obtaining a truly hermetic seal between the backcap and the base, rather than obtaining the "semi-hermetic" seal discussed above and shown in FIG. 4. It should also be understood that various materials may be used for the backcap. For example, the backcap itself may be fabricated from glass, and the glass backcap and base then bonded by a solder or welding operation to again form a truely hermetic seal. In either event, however, the backcap is preferably bonded to either the vitreous substrate 12 or to the conductive layer 40 on the vitreous substrate. The glass plate and tin oxide layer thus form a base for the photovoltaic cells, as explained above, and this combination of a vitreous base with an optional top or inner surface conductive layer is herein referred to as a vitreous substrate. If the backcap is transparent to light, then the substrate for the thin film layers need not, but may, be vitreous.

The techniques of the present invention may be used for back wall or front wall photovoltaic cells, and are particularly applicable to polycrystalline thin film photovoltaic panels having a plurality of photovoltaic cells connected in series electrically. Various types of series connections between individual polycrystalline photovoltaic cells may be used in accordance with the concepts of the present invention, although the comparatively low cost series connection shown in FIG. 3 is currently preferred and does not cause a problem when used in conjunction with the backcap discussed herein even though the series interconnection results in a non-planar top electrode. In another suitable embodiment of a photovoltaic panel according to the present invention, the top conductive layer is applied over a permanent resist and extends down to the conductive tin oxide layer. The permanent resist fills an elongate cut in the tin oxide layer in a manner similar to that discussed above. Instead of utilizing a strippable resist, however, the applied top coductor layer, as well as the polycrystalline layers therebeneath and forming the heterojunction, are cut in the vicinity of the tin oxide layer/top electrode layer connection, thereby placing adjacent cells in series connection.

It is also possible according to the techniques of the present invention to reinject a new gas into the spacing between the backcap and the photovoltaic cells, thereby minimizing further cell degradation or possibly even increasing cell efficiency. The gas input and gas egress ports could be reopened after the photovoltaic device was in operation for a time period of, e.g., years, the gas therein purged, a new gas input to the spacing, and the input and egress ports then resealed. While two such ports are currently preferred, one such port may suffice. As an example, a vacuum could be drawn on the spacing utilizing a single port, thereby removing substantially all deleterious gas from the spacing, then that one port resealed.

These and further modifications will become apparent from the foregoing description, and are considered within the concepts of the present invention. Moreover, it should be understood that the embodiments described above and illustrated in the accompanying drawings are provided by way of illustration only, and the invention is not necessarily limited to the embodiments described. Alternative embodiments and operating techniques and representing modifications from the embodiments described herein thus can be made without departing from the spirit of the invention.

What is claimed is:

1. An improved stability photovoltaic panel, comprising a plurality of photovoltaic cells each having a plurality of polycrystalline thin film layers, each of the plurality of thin film layers respectively deposited on a common vitreous substrate for allowing light to pass therethrough to reach a photovoltaic hetrojunciton formed by at least two of the plurlaity of thin film layers, at least one of the film layrs forming the photovoltaic heterojunction for each of the plurlaity of photovoltaic cells, each of the photovoltaic cells lying within a plane substantially parallel to an interior planar surface of the vitreous substrate, each of the photovoltaic cells being connected electrically in series to pass electrical current from the photovoltaic panel, a pliable sheet material backcap opposite the vitreous substrate with respect to the plurality of photovoltaic cells and spaced from the plurality of photovoltaic cells so as to form a substantially planar spacing between the plurality of photovoltaic cells and an interior surface of the sheet material backcap, a perimeter portion of the sheet material backcap having a bend for positioning an edge strip of the sheet material backcap spaced from the interior surface of the backcap to form the planar spacing, the edge strip forming a planar surface parallel with an sealingly engaging the vitreous substrate for forming a fluid-tight seal with the vitreous substrate about the perimeter of the plurality of photovoltaic cells for protecting the plurality of photovoltaic cells from elements exterior of the photovoltaic panel, and a selected desiccant filling substantially the planar spacing for preventing water vapor within the planar spacing from adversely affecting the plurality of photovoltaic cells.

2. The photovoltaic panel as defined in claim 1, wherein the selected desiccant is thermally conductive for transmitting heat from the plurality of photovoltaic cells to the sheet metal material backcap.

3. The photovoltaic panel as defined in claim 1, wherein the vitreous substrate includes an electrically conductive thin film layer formed on an interior surface of the vitreous substrate.

4. The photovoltaic panel as defined in claim 1, further comprising:
the fluid-tight seal is a semi-hermetic perimeter seal between the sheet material backcap and the vitreous substrate; and
a pliable adhesive for forming the semi-hermetic perimeter seal between the sheet material backcap and the vitreous substrate.

5. The photovoltaic panel as defined in claim 1, wherein the sheet material backcap lies substantially within a plane parallel to an interior surface of the vitreous substrate.

6. The photovoltaic panel as defined in claim 1, further comprising:
a sealable fluid input port for passing a purging gas through the sheet material backcap and into the spacing; and
a sealable fluid egress port for simultaneously passing the purging gas from the spacing past the sheet material backcap.

7. An improved stability photovoltaic panel comprising:
a plurality of photovoltaic cells each having a plurality of polycrystalline thin film layers;
each of the plurality of thin film layers deposited respectively on a common vitreous substrate for allowing light to pass therethrough to reach a photovoltaic heterojunction formed by at least two of the plurality of thin film layers;
each of the photovoltaic cells being connected electrically in series to pass electrical current from the photovoltaic panel;
a hermetic sheet material backcap opposite the vitreous substrate with respect tot eh plurality of photovoltaic cells and spaced from the plurality of photovoltaic cells to form a spacing between the plurality of photovoltaic cells and an interior surface of the sheet material backcap;
the sheet material backcap forming a fluid-tight seal with the vitreous substrate about the perimeter of the plurality of photovoltaic cells for protecting the plurality of photovoltaic cells from elements exterior of the photovoltaic panel;
a sealable fluid input port for passing a purging gas through the sheet material backcap and into the spacing; and
a sealable fluid egress port for simultaneously passing the purging gas from the spacing past the sheet material backcap.

8. The photovoltaic panel as defined in claim 7, wherein the sealable fluid input port comprises:
a fluid conduit having a fluid flow path and passing through the sheet material backcap:
an exterior surface of the fluid conduit being hermetically sealed with the sheet material backcap; and
the flow path within the fluid conduit being in fluid communication with the spacing and hermetically sealed from the exterior of the photovoltaic panel.

9. The photovoltaic panel as defined in claim 7, further comprising:
the sealable fluid input port includes a first electrically conductive fluid conduit;
the sealable fluid egress port includes a second electrically conductive fluid conduit;
elongate pliable wire conductors within the spacing and each interconnected electrically at one end to the plurality of photovoltaic cells and interconnected electrically at the respective other ends to the first and second electrically conductive conduits;
a pair of output wires each connected at one end to a respective one of the first and second conduits, such that one of the conduits represents and electrically positive conductor of the photovoltaic panel and the other of the conduits represents an electrically negative conductor of the photovoltaic panel.

10. The photovoltaic panel as defined in claim 7, wherein the spacing between the sheet material backcap and the plurality of photovoltaic cells is substantially filled with a selected desiccant for preventing water vapor within the spacing from deleteriously affecting the plurality of photovoltaic cells.

11. The photovoltaic panel as defined in claim 10, wherein the selected desiccant is thermally conductive for transmitting heat from the plurality of photovoltaic cells to the sheet material backcap.

12. The photovoltaic panel as defined in claim 7, wherein a perimeter portion of the sheet material backcap is in sealing engagement with the vitreous substrate and the sheet material backcap lies substantially within a plane parallel to an interior surface of the vitreous substrate.

13. The photovoltaic panel as defined in claim 7, wherein at least two of the thin film layers of each of the plurality of photovoltaic cells lie within a substantially horizontal plane parallel to an interior surface of the vitreous substrate.

14. The photovoltaic panel as defined in claim 7, wherein each of the photovoltaic cells includes a thin film layer consisting essentially of cadmium telluride.

15. The photovoltaic panel as defined in claim 14, wherein each of the photovoltaic cells includes another thin film layer consisting essentially of caldium sulfide.

16. The photovoltaic panel as defined in claim 7, wherein each of the photovoltaic cells is a substantially planar elongate strip formed on the vitreous substrate and spaced from an adjacent strip by an electrical connection to connect the strips electrically in a series.

17. The photovoltaic panel as defined in claim 16, wherein the electrical connection between the adjacent strips is a conductive thin film layer having a first portion adjacent the vitreous substrate and a second portion opposite the vitreous substrate with respect to the first portion.

18. The photovoltaic panel as defined in claim 7, wherein the sheet material backcap is sealed to the vitreous substrate by a pliable adhesive for dampening stresses between the sheet material backcap and the vitreous substrate attributable to thermal expansion, the adhesive forming a semi-hermetic seal between the sheet material backcap and the vitreous substrate.

19. The photovoltaic panel as defined in claim 7, wherein the sheet material backcap has a thickness of from 2 mils to 8 mils.

20. A method of improving the stability of a photovoltaic panel including a plurality of photovoltaic cells each having a plurality of polycrystalline thin film layers, each of the plurality of thin film layers respectively deposited on a common vitreous substrate for allowing light to pass therethrough to reach a photovoltaic heterojunction formed by at least two of the plurality of thin film layers, the method comprising:
electrically connecting each of the plurality of photovoltaic cells in series for passing electrical current from the photovoltaic panel;
positioning a hermetic sheet material backcap opposite the substrate with respect tot he plurality of photovoltaic cells and spaced from the plurality of photovoltaic cells so as to form the spacing therebetween;
filling substantially the entirety of the spacing with a selected desiccant for preventing water vapor within the spacing from deleteriously effecting the plurality of photovoltaic cells; and
sealingly engaging a perimeter portion of the sheet material backcap in a fluid-tight manner to the vitreous substrate about the perimeter of the plurality of photovoltaic cells for protecting the plurality of photovoltaic cells form elements exterior of the photovoltaic panel.

21. The method of forming a photovoltaic panel as defined in claim 20, further comprising:
adhering the selected desiccant to an interior surface of the sheet material backcap prior to positioning the backcap opposite the substrate with respect to the plurality of photovoltaic cells.

22. The method of forming a photovoltaic panel as defined in claim 20, wherein the vitreous substrate is glass having its interior surface coating with an electrically conductive film.

23. The method of forming a photovoltaic panel as defined in claim 20, wherein the material for the sheet material backcap is selected from a metal alloy including a metal selected from the group consisting of nickel and titanium.

24. The method of forming a photovoltaic panel as defined in claim 20, wherein the step of sealingly engaging a perimeter portion of the sheet material backcap to the vitreous substrate comprises:
applying an adhesive to a sealing surface of the vitreous substrate; and
curing the adhesive material to form a semi-hermetic seal between the vitreous substrate and the sheet material backcap, the cured adhesive being pliable for reducing stresses between the vitreous substrate and the sheet material backcap.

25. The method of forming a photovoltaic panel as defined in claim 20, wherein the step of sealingly engaging a perimeter portion of the sheet material backcap to the vitreous substrate comprises:
selecting a material for at least the perimeter of the sheet material backcap as a function of its coefficient of thermal expansion and the coefficient of thermal expansion of a sealing surface of the vitreous substrate; and
forming a hermetic seal between the sheet material backcap and the vitreous substrate.

26. The method of forming a photovoltaic panel as defined in claim 20, further comprising:
forming a bend in the perimeter portion of the sheet material backcap for positioning an edge strip of the sheet material backcap spaced from an interior surface of the backcap to form the spacing; and
forming a planar surface on the edge strip parallel with the substrate for sealingly engaging the substrate.

27. The method of forming a photovoltaic panel as defined in claim 20, further comprising:
forming a gas input port through the sheet material backcap for passing a a purging gas into the spacing;
forming a gas egress port through the sheet material backcap for passing a purging gas from the spacing;
purging the spacing with the purging gas by inputting the gas through the gas input port while exhausting the gas from the gas egress port; and
thereafter sealing the gas input port and the gas egress port.

28. The method of forming a photovoltaic panel as defined in claim 27, further comprising:
the step of sealingly engaging a perimeter portion of the sheet material backcap to the vitreous substrate includes curing a bond between the perimeter of the sheet material backcap and the vitreous substrate; and
the step of purging the spacing with the purging gas occurs throughout the time of curing the bond between the perimeter of the sheet material backcap and the vitreous substrate.

29. A method of improving the stability of a photovoltaic panel including a plurality of photovoltaic cells each having a plurality of polycrystalline thin film layers, each of the plurality of thin film layers respectively deposited on a vitreous substrate for allowing light to pass therethrough to reach a photovoltaic heterojunction formed by at least two of the plurality of thin film layers, the method comprising:

electrically connecting each of the plurality of photovoltaic cells in series for passing electrical current from the photovoltaic panel;

positioning a hermetic sheet material backcap opposite the substrate with respect to the plurality of photovoltaic cells and spaced from the plurality of photovoltaic cells so as to form a spacing therebetween;

sealing the sheet material backcap in a fluid-tight manner to the vitreous substrate about the perimeter of the plurality of photovoltaic cells for protecting the plurality of photovoltaic cells from elements exterior of the photovoltaic panel;

forming a gas input port for passing a purging gas through the sheet material backcap and into the spacing;

forming a gas egress port for simultaneously passing the purging gas from the spacing past the sheet material backcap;

thereafter passing a purging gas into the sealed spacing to remove deleterious fluid therefrom; and thereafter sealing both the fluid input port and the fluid egress port.

30. The method of forming a photovoltaic panel as defined in claim 29, wherein:

the step f sealing the backcap to the vitreous substrate includes the steps of (a) placing an adhesive between the perimeter of the backcap and the vitreous substrate, and (b) subsequently curing the adhesive; and the step of introducing the purging gas is performed during at least some stage of the adhesive curing process.

31. The method of forming a photovoltaic panel as defined in claim 29, further comprising:

introducing a selected gas into the spacing subsequent to the step of passing a purging gas into the spacing and prior to sealing the fluid port to protect the plurality of photovoltaic cells from elements exterior of the photovoltaic panel.

32. The method as defined in claim 31, wherein the selected gas is an inert gas selected from a group consisting of nitrogen, argon, and helium.

33. The method as defined in claim 29, further comprising:

filling substantially the entirely of the spacing with a selected desiccant for preventing water vapor within the spacing from deleteriously affecting the plurality of photovoltaic cells.

34. The method of forming a photovoltaic panel as defined in claim 33, further comprising:

adhering the selected desiccant to an interior surface of the sheet material backcap prior to positioning the backcap opposite the substrate with respect to the plurality of photovoltaic cells.

35. The method of forming a photovoltaic panel as defined in claim 33, wherein the selected desiccant is thermally conductive for transmitting heat from the plurality of photovoltaic cells to the sheet material backcap.

36. The method of forming a photovoltaic panel as defined in claim 28, wherein the vitreous substrate is glass having its interior surface coated with an electrically conductive film.

37. The method of forming a photovoltaic panel as defined in claim 29, wherein the material for the sheet material backcap is selected from a metal alloy including a metal selected from the group consisting of nickel and titanium.

38. The method of forming a photovoltaic panel as defined in claim 29, wherein the step of sealing the sheet material backcap to the vitreous substrate comprises:

applying an adhesive to a sealing surface of the vitreous substrate; and curing the adhesive material to form a semi-hermetic seal between the vitreous substrate and the sheet material backcap, the cured adhesive being pliable for reducing stresses between the vitreous substrate and the sheet material backcap.

39. The method of forming a photovoltaic panel as defined in claim 29, wherein the step of sealing the sheet material backcap to the vitreous substrate comprises selecting a material for at least the perimeter of the sheet material backcap as a function of its coefficient of thermal expansion and the coefficient of thermal expansion of the sealing surface of the vitreous substrate; and forming a hermetic seal between the sheet material backcap and the vitreous substrate.

40. The method of forming a photovoltaic panel as defined in claim 29, further comprising:

each of the gas input port and the gas output port being formed form a electrically conductive conduit passing through the sheet material backcap and having a flow path in fluid communication with the spacing and hermetically sealed form the exterior of the photovoltaic panel, such that one of the electrically conductive conduits serves as a respective electrically positive conductor of the photovoltaic panel and the other of the electrically conductive conduits serves as an electrically negative conductor of the photovoltaic panel.

41. The method of forming a photovoltaic panel as defined in claim 29, wherein each of the photovoltaic cells includes a film layer consisting essentially of cadmium telluride.

42. The method of forming a photovoltaic panel as defined in claim 29, further comprising:

forming each of the photovoltaic cells in a substantially planar elongate strip on the vitreous substrate and spaced from the adjacent strip by an electrical connection to connect the strips electrically in series; and connecting adjacent strips electrically in series by depositing a conductive thin film layer between adjacent strips, the conductive thin film layer having a first portion adjacent the vitreous substrate and a second portion opposite the vitreous substrate with the respect to the first portion.

* * * * *

UNITED STATES PATENT AND TRADEMARK OFFICE
CERTIFICATE OF CORRECTION

PATENT NO. : 5,022,930

DATED : June 11, 1991

INVENTOR(S) : Bruce Ackerman, Scot P. Albright and John F. Jordan

It is certified that error appears in the above-identified patent and that said Letters Patent is hereby corrected as shown below:

In Column 13, line 16 (Claim 1, line 8), change "layrs" to -- layers --.

In Column 13, line 17 (Claim 1, line 9), change "plurlaity" to -- plurality --.

In Column 13, line 33 (Claim 1, line 25), change "an" to -- and --.

In Column 14, line 14 (Claim 7, line 14), delete "tot eh" and insert -- to the --.

In Column 14, line 53 (Claim 9, line 15), change "and" to -- an --.

In Column 17, line 30 (Claim 30, line 3), change "f" to -- of --.

In Column 18, line 4 (Claim 36, line 2), change "28" to -- 29 --.

In Column 18, line 24 (Claim 39, line 3), add a ":" after "comprises".

Signed and Sealed this

Seventeenth Day of November, 1992

Attest:

DOUGLAS B. COMER

*Attesting Officer*          *Acting Commissioner of Patents and Trademarks*